Figure 1:
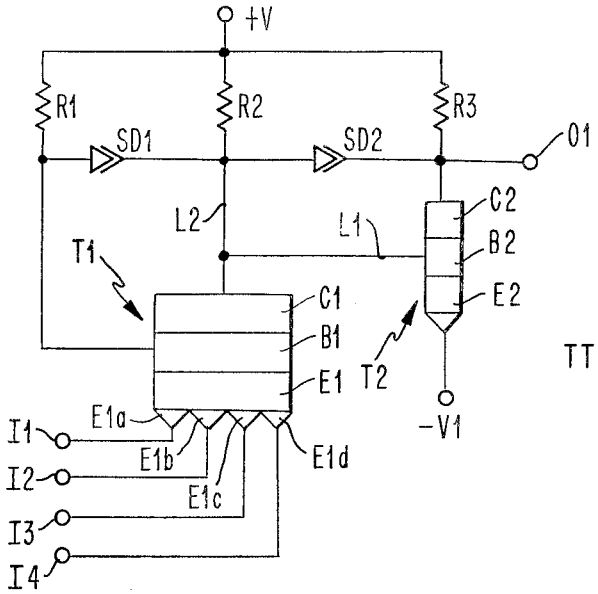
Figure 2:
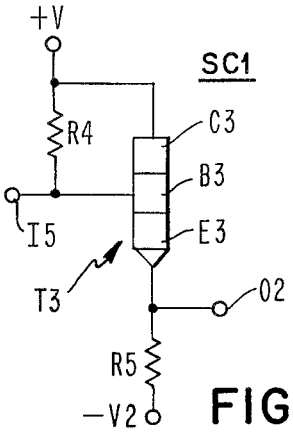
Figure 3:
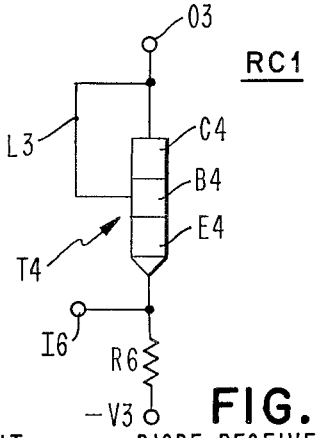
Figure 5:
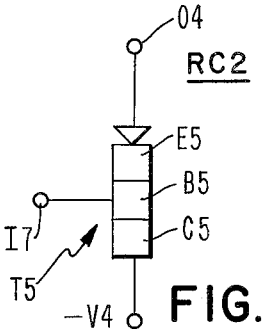
Figure 7:
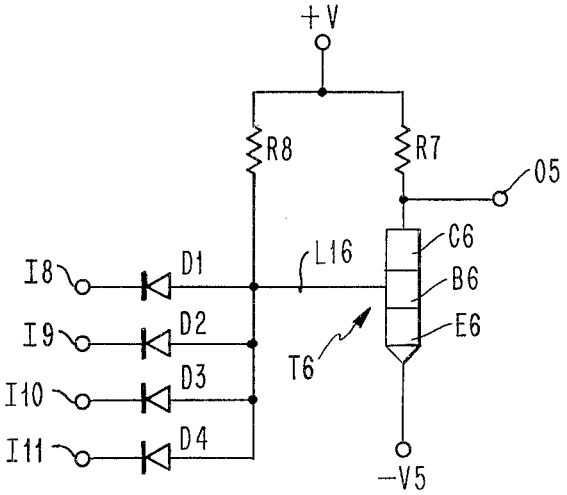
Figure 4A:
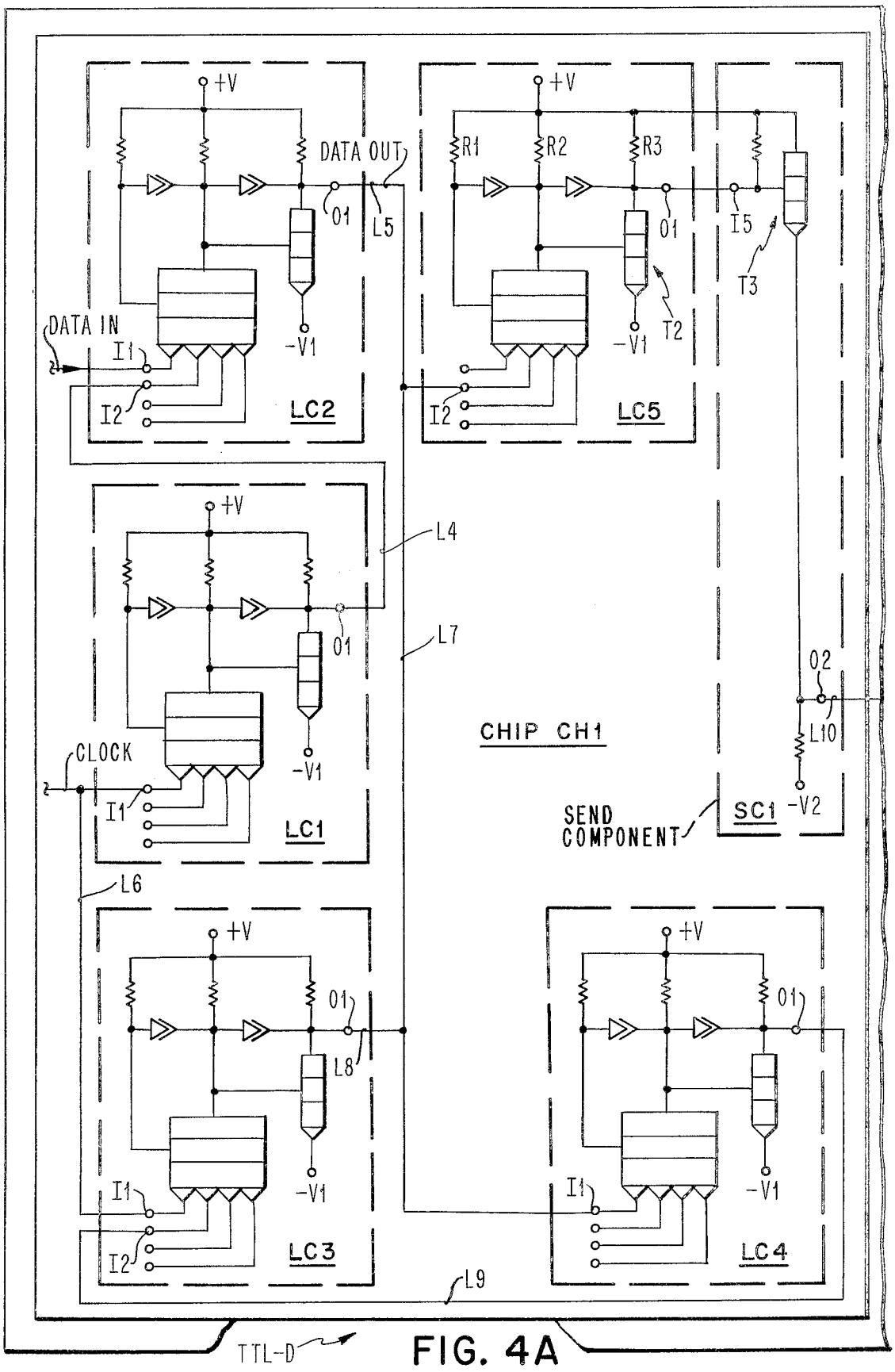
Figure 4B:
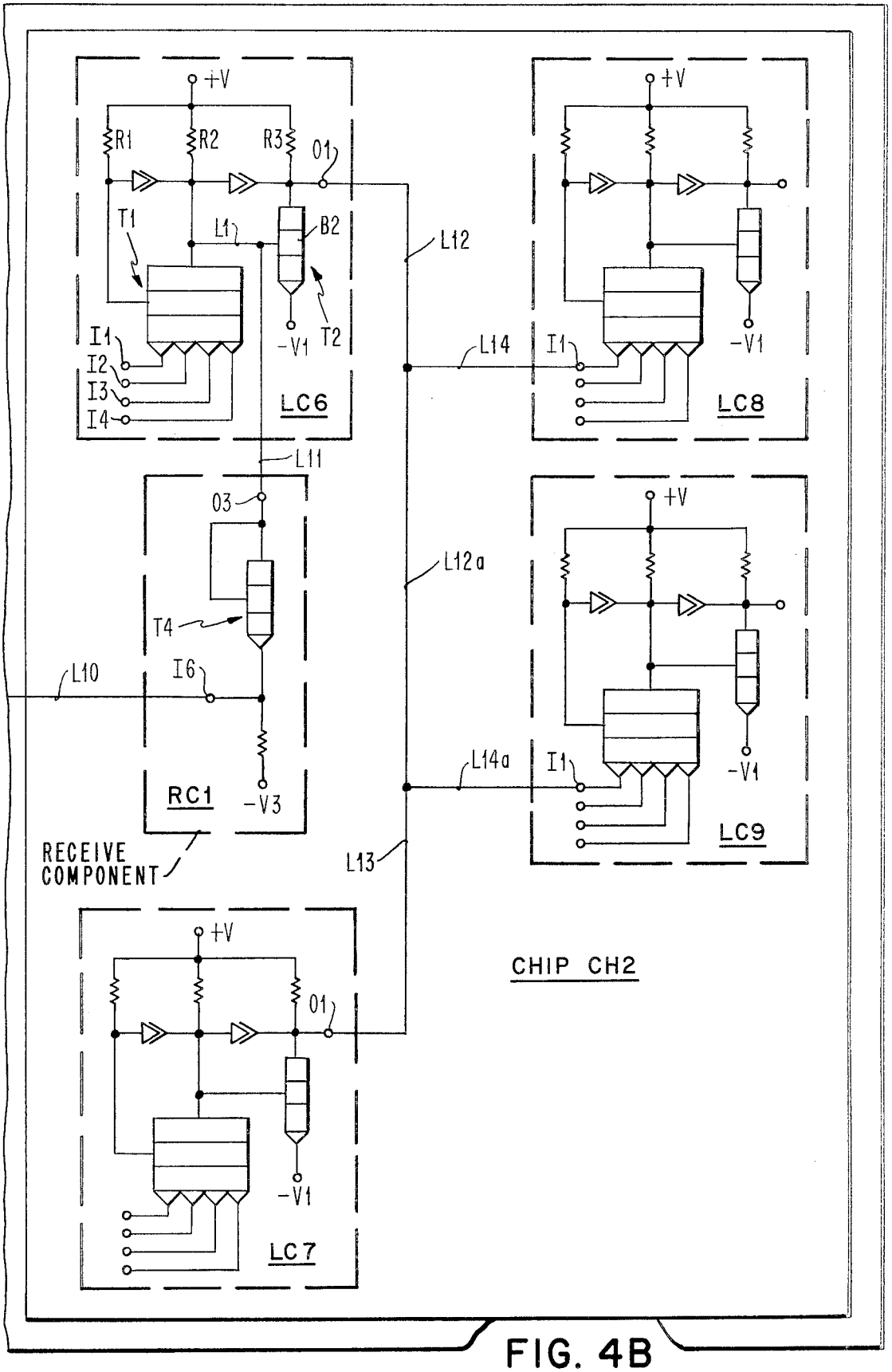
Figure 6A:
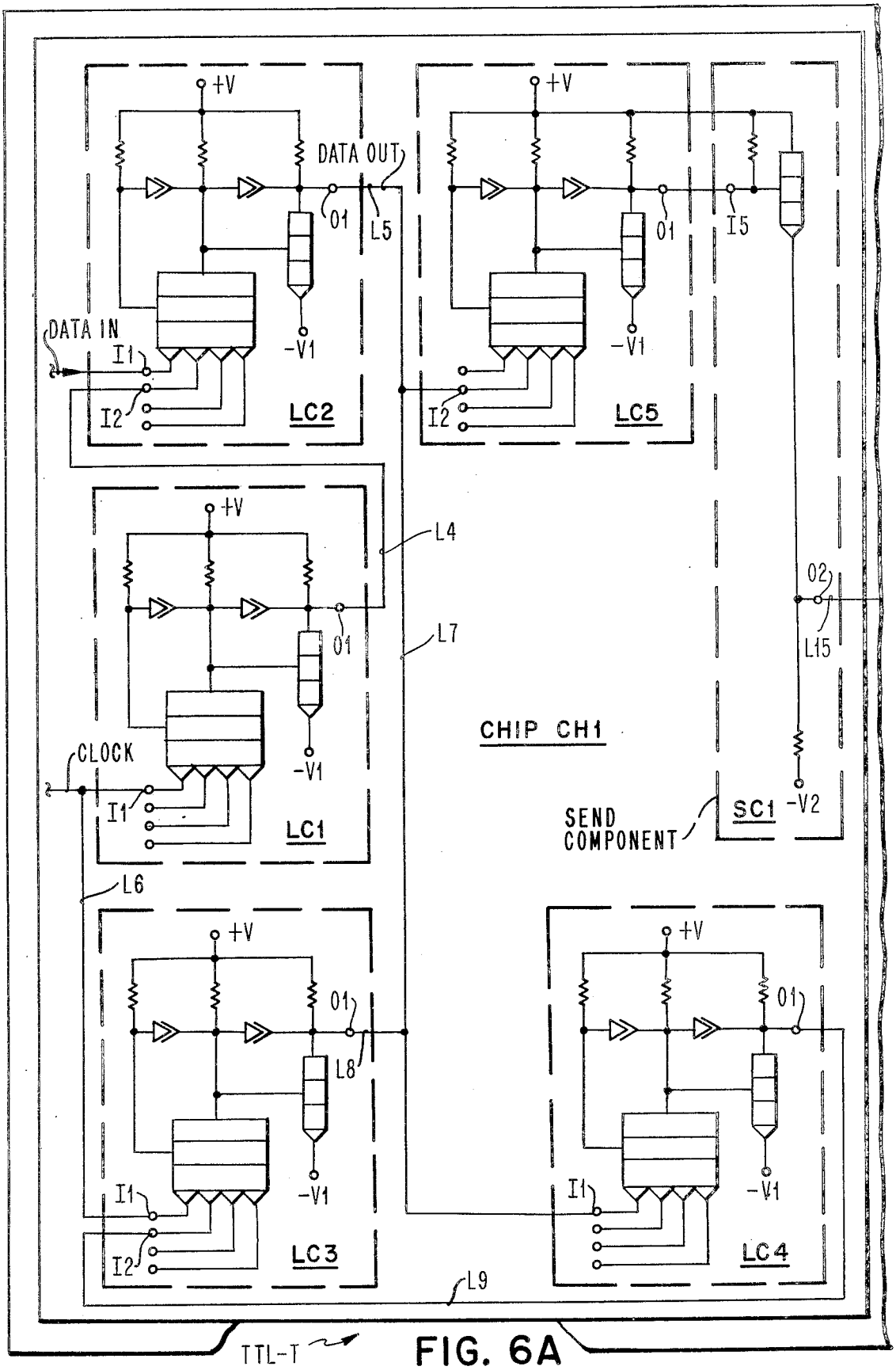
Figure 6B:
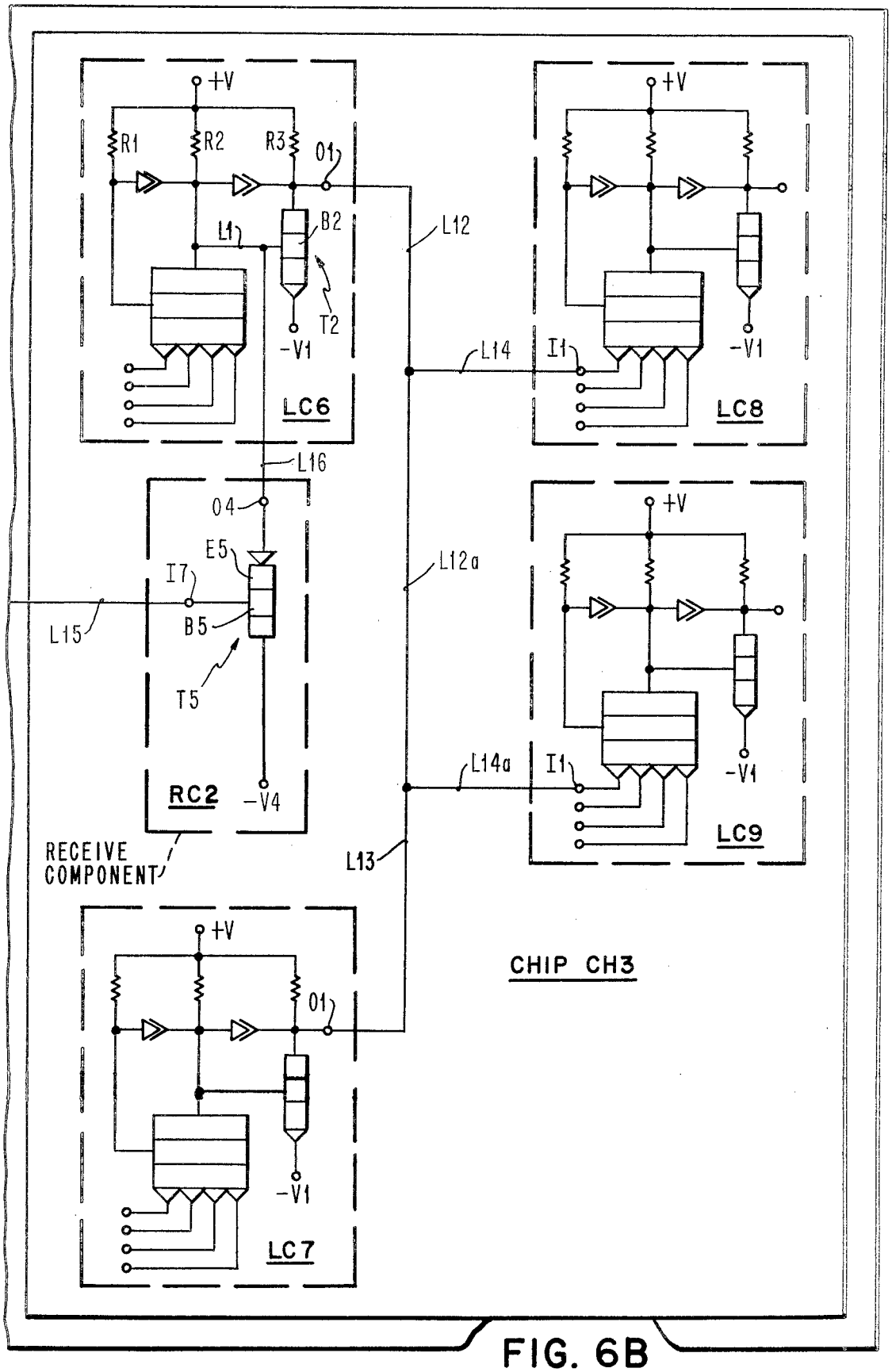
Figure 8A:
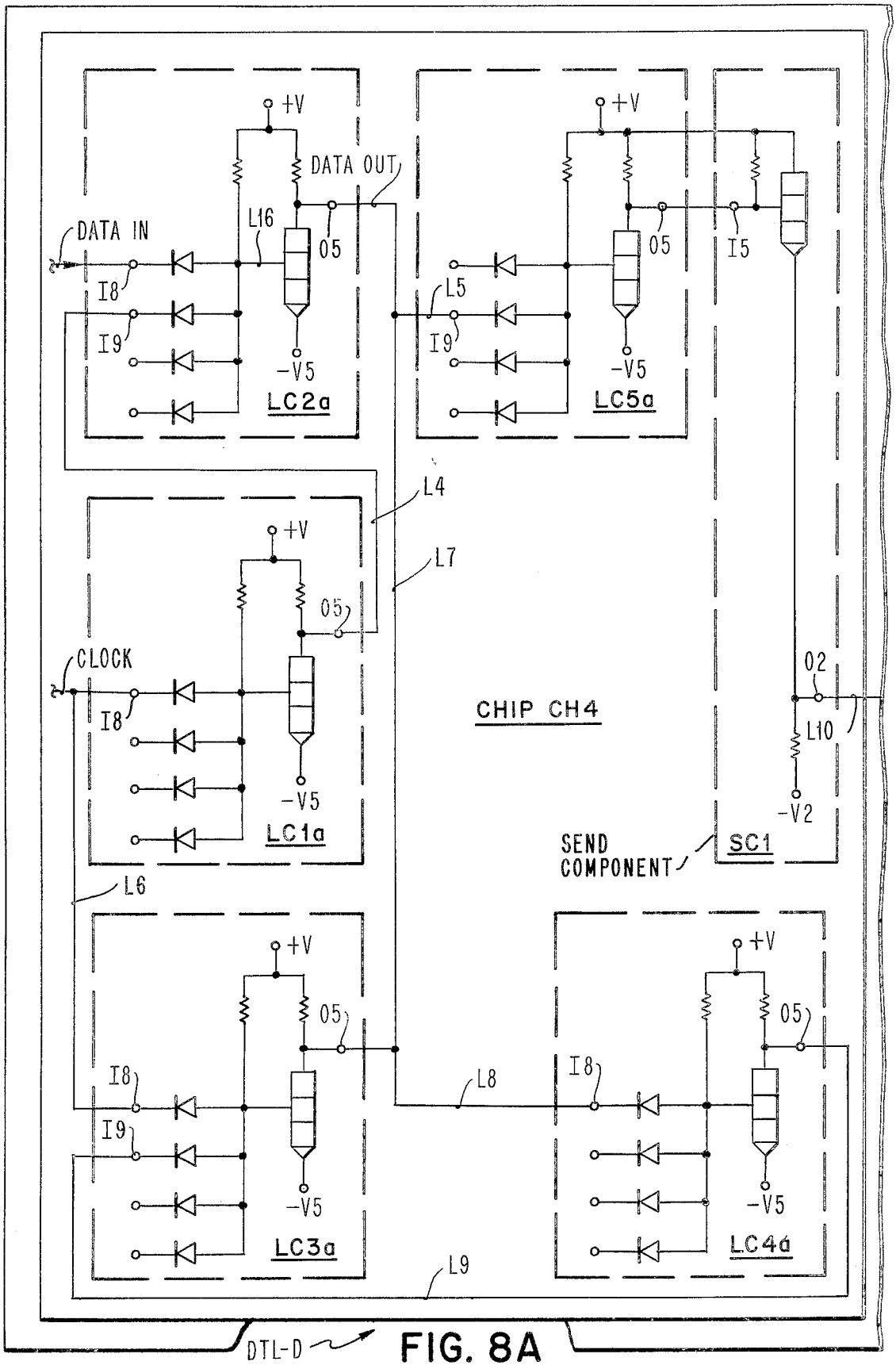
Figure 8B:
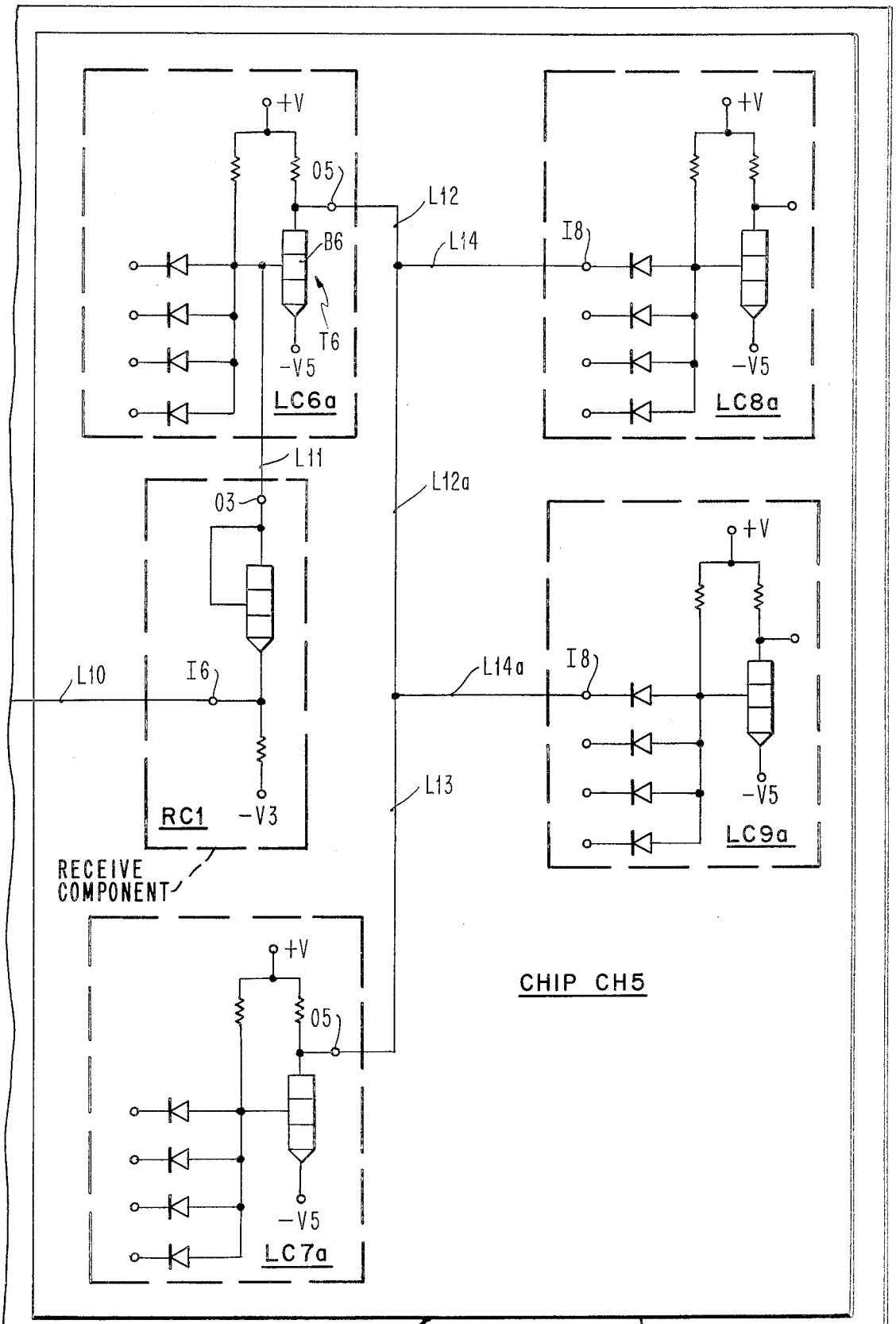
Figure 9A:
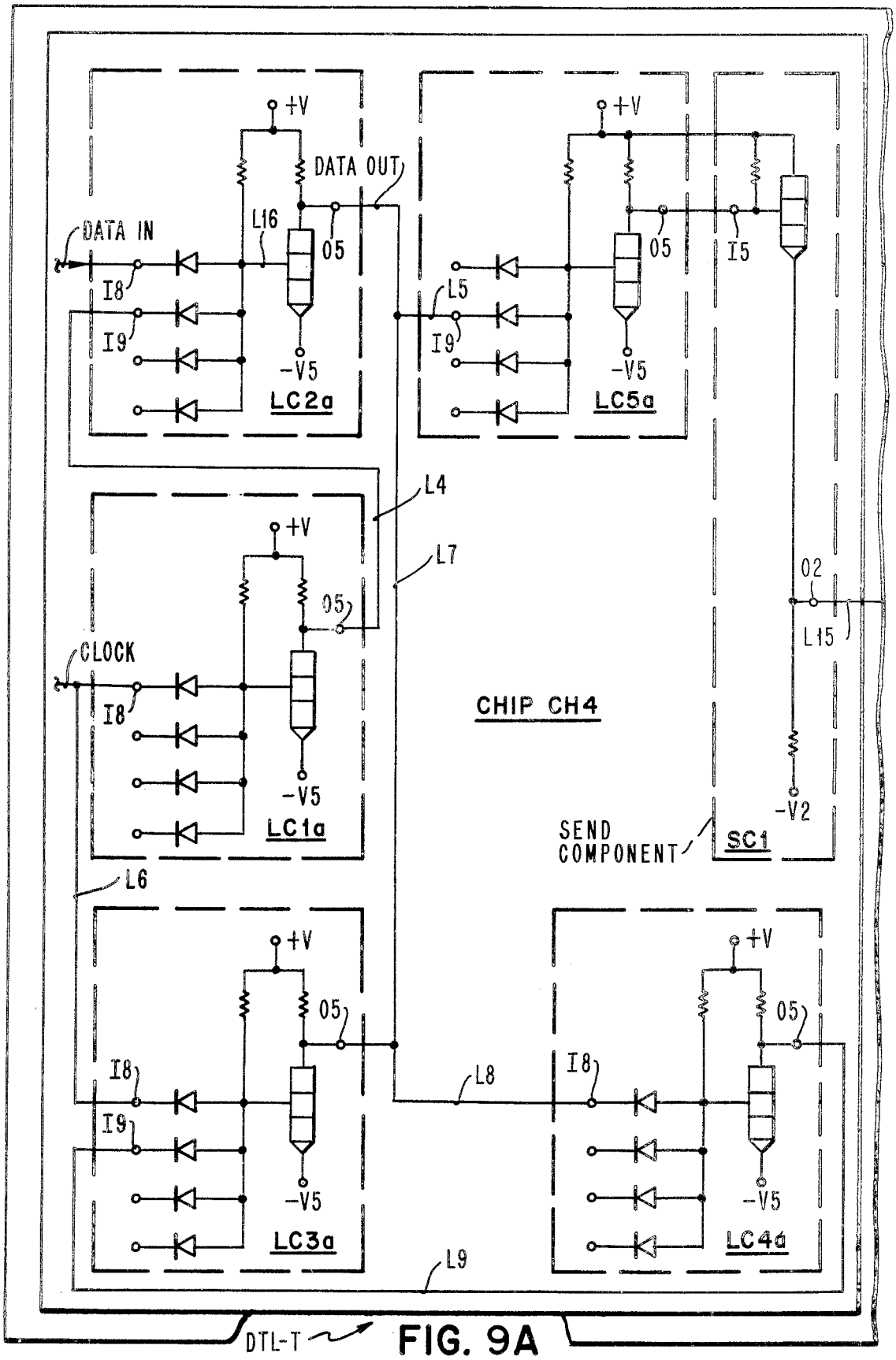
Figure 9B:
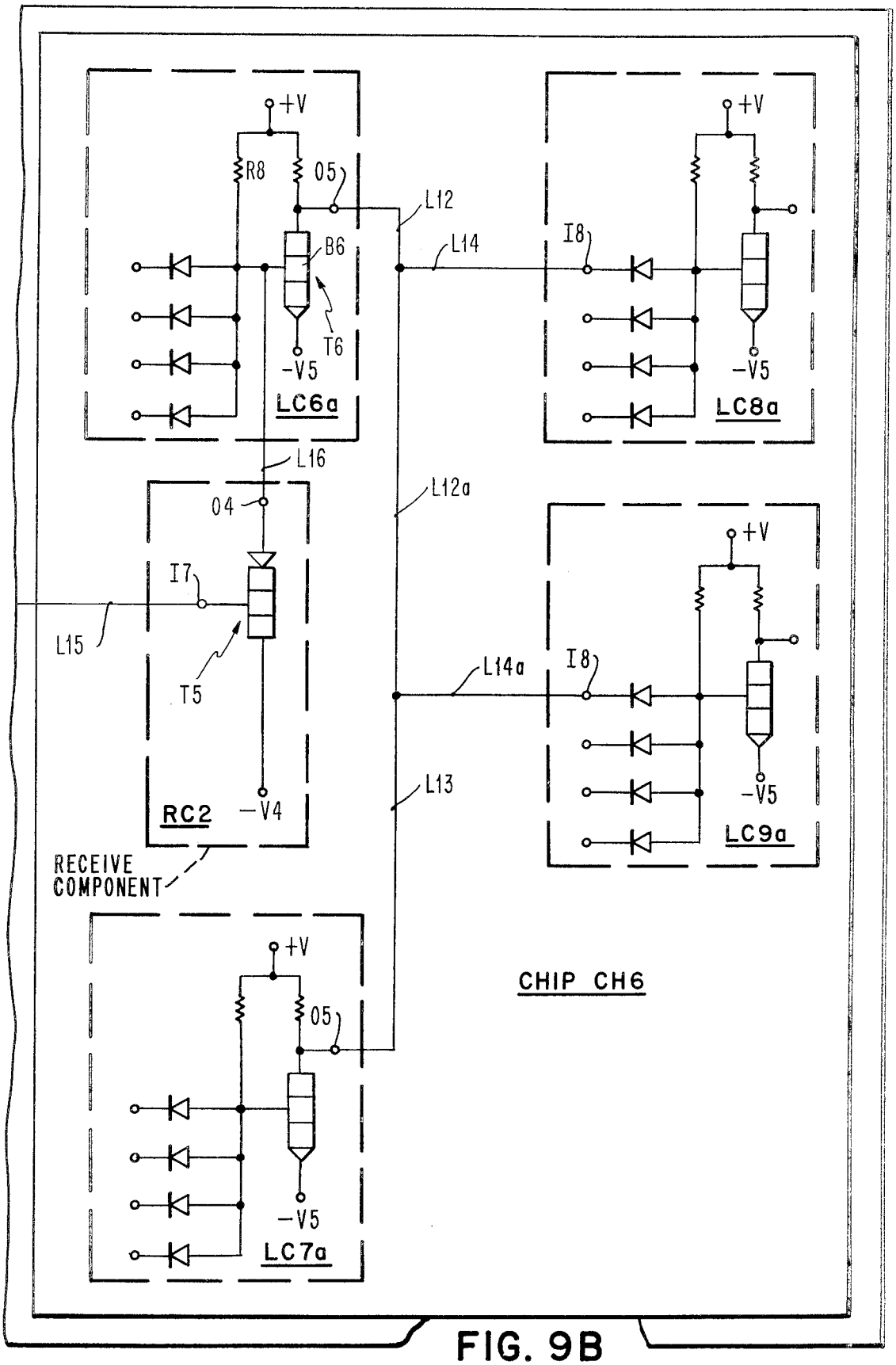

United States Defensive Publication

[19] (H) [11] T957,007

Jordan et al. [43] Apr. 5, 1977

[54] VOLTAGE-MODE LOGIC CIRCUITRY WITH IMPROVED INPUT/OUTPUT CHARACTERISTICS

[75] Inventors: Paul V. Jordan, Poughkeepsie; Robert F. Sechler, Wappingers Falls, both of N.Y.

[73] Assignee: International Business Machines Corporation, Armonk, N.Y.

[21] Appl. No.: 710,764

[22] Filed: July 30, 1976

Related U.S. Application Data

[63] Continuation of Ser. No. 450,279, March 11, 1974, abandoned, which is a continuation of Ser. No. 265,136, June 22, 1972, abandoned.

[51] Int. Cl.[2] ..... H03K 19/08; H01L 27/00

[52] U.S. Cl. ..... 307/213; 307/215; 307/270; 307/317 A; 307/DIG. 1

[57] ABSTRACT

Coupling of signals between Large Scale Integrated Circuit chips is facilitated by provision of an emitter follower output stage for the chip. Special input circuits are also provided. The logic circuits may be DTL or Schottky TTL. The special input circuit may be a DTL type or a CTL (complementary transistor logic) type. Pull down resistors may be employed with the emitter follower output driver and the special DTL input circuit.

1 Claim, 9 Sheets Drawing,

22 Pages Specification

The file of this unexamined application may be inspected and copies thereof may be purchased (849 O.G. 1221, Apr. 9, 1968).

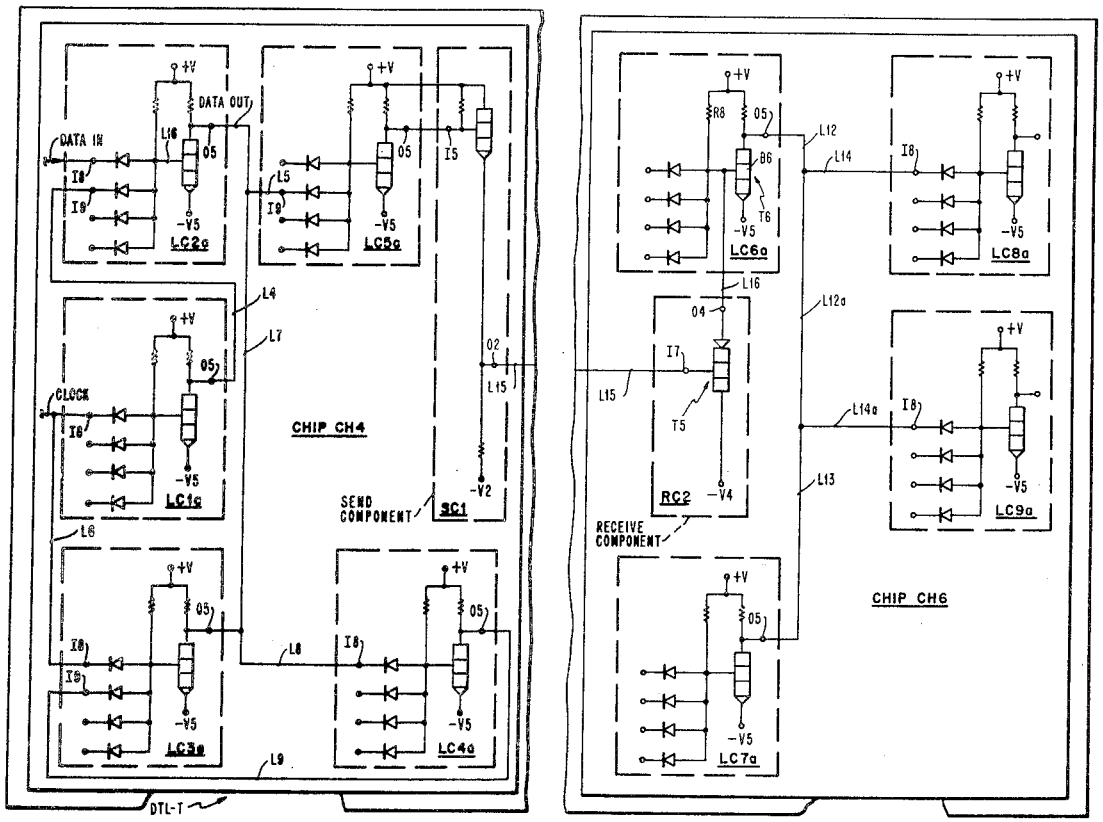

TTL LOGIC CIRCUIT
PRIOR ART

SEND COMPONENT

DIODE RECEIVE COMPONENT

TRANSISTOR
RECEIVE COMPONENT

DTL LOGIC CIRCUIT
PRIOR ART